United States Patent [19]

Kijima

[11] Patent Number: 5,903,101
[45] Date of Patent: May 11, 1999

[54] OPTICAL ELEMENT AND METHOD OF MANUFACTURING THE SAME

[75] Inventor: Yasunori Kijima, Tokyo, Japan

[73] Assignee: Sony Corporation, Tokyo, Japan

[21] Appl. No.: 08/783,894

[22] Filed: Jan. 16, 1997

[30] Foreign Application Priority Data

Jan. 26, 1996 [JP] Japan ..................................... 8-032609

[51] Int. Cl.⁶ ............................... H01J 1/62; H01J 63/04; H01J 17/20; H01J 61/12
[52] U.S. Cl. ........................ 313/506; 313/574; 313/495; 313/497; 313/630; 313/633
[58] Field of Search .......................... 340/324 M, 324 R, 340/166 EL, 781–784; 315/169 TV; 358/59, 241; 313/509, 498, 503, 574, 633, 495, 497, 506; 428/690, 917; 522/100; 430/20; 257/103, 78

[56] References Cited

U.S. PATENT DOCUMENTS

| | | | |
|---|---|---|---|
| 3,977,009 | 8/1976 | Ohtsuka et al. | 346/74 R |
| 4,170,772 | 10/1979 | Bly | 340/781 |
| 4,734,618 | 3/1988 | Matsudaira et al. | 313/509 |
| 4,869,973 | 9/1989 | Nishikawa et al. | 428/690 |
| 5,229,628 | 7/1993 | Kobayashi et al. | 257/103 |
| 5,596,023 | 1/1997 | Tsubota et al. | 522/100 |

*Primary Examiner*—Lynette F. Smith
*Assistant Examiner*—Datquan Lee
*Attorney, Agent, or Firm*—Hill & Simpson

[57] ABSTRACT

An organic electroluminescent element ("organic EL element") capable of emitting light with high luminance by driving at a low voltage, and inhibiting deterioration in organic layers is provided. A surface treatment of an indium-tin oxide (ITO) transparent electrode with a titanate coupling agent containing phosphorus in the side chain thereof improves adhesion between the ITO transparent electrode and an organic hole transport layer. As a result, it is possible to increase the efficiency of injection of holes, improve low-voltage driving and luminance, and prevent deterioration in the organic layers.

6 Claims, 11 Drawing Sheets

$\underbrace{\phantom{(CH_3)_2CHO\text{——}Ti}}_{\substack{X\\(\text{MAIN CHAIN})}}$  $\underbrace{\phantom{-(O-S-\bigcirc-C_{12}H_{25})_3}}_{\substack{Y\\(\text{SIDE CHAIN})}}$

| | EXAMPLE 1 | EXAMPLE 2 | EXAMPLE 3 | COMPARATIVE EXAMPLE 1 | COMPARATIVE EXAMPLE 2 |
|---|---|---|---|---|---|
| CHANGE IN SURFACE ENERGY | ▬ ▬ | ▬ | ▬ | 0 | + + |

▬   DECREASE IN SURFACE ENERGY

▬ ▬   SIGNIFICANT DECREASE IN SURFACE ENERGY

+ +   SIGNIFICANT INCREASE IN SURFACE ENERGY

OPTICAL ELEMENT AND METHOD OF MANUFACTURING THE SAME

FIELD OF THE INVENTION

The present invention relates to an optical element and a method of manufacturing the same. More specifically, the present invention relates to an optical element and a method of manufacturing the same that is suitable, for example, as a self-luminescent plane display. Still more specifically, the present invention relates to an organic electroluminescent display comprising an organic thin film used as an electroluminescent layer.

BACKGROUND OF THE INVENTION

The importance of an interface between a human operator and a machine being used in a multimedia capacity or personal computer has recently increased. In order for an operator to comfortably and efficiently operate such a machine, it is necessary for the operator to briefly and instantly obtain a sufficient amount of information from the machine relating to the operation of the machine without an error. Because such information needs to be supplied to the operator by way of a display device, research has been made on various display devices to improve the quality thereof.

Currently, the demand for a small thin display device increases as the miniaturization of machines increases. For example, the further miniaturization of a lap-top personal computer comprising a display device integrated therewith, such as a "notebook" type personal computer surprisingly progresses, accompanied by significant technical revolution of a liquid crystal display serving as the display device.

At present, the liquid crystal display is widely used as an interface for various products including a lap-top personal computer, small televisions, watches and desk-top calculators.

Such a liquid crystal display (LCD) has been researched for making use of the advantages of a liquid crystal, such as a low driving voltage and low power consumption, and using as an interface between a human being and a machine and as a main display element in devices ranging from a small device to a large-capacity display device.

However, since this liquid crystal display does not emit light by itself, it requires a backlight and therefore electric power for driving the backlight. In fact, the backlight consumes more power than the liquid crystal. As a result, the operation of the backlight decreases the operating time of the battery or portable power supply and therefore places a limitation of the use of liquid crystal displays.

The liquid crystal display also has the shortcomings in that, since the liquid crystal display has a narrow angle of visibility, it is unsuitable for a large display device. Unfortunately, the displaying method employs the orientation state of liquid crystal molecules and the contrast changes with the angle even within the angle of visibility.

In consideration of a driving method for a visual display, although an active matrix method exhibits a sufficient response speed for handling a moving image, an active matrix method uses a TFT driving circuit, and it is thus difficult to increase the screen size due to pixel defects. The use of the TFT driving circuit is also expensive.

Although a simple matrix method as another driving method is lower in cost than an active matrix method, and makes it relatively easy to increase the screen size, the simple matrix method has shortcomings with respect to an insufficient response speed for handling a moving image.

On the other hand, a plasma display device, an inorganic electroluminescent device, an organic electroluminescent display, and the like are studied as luminescent display device.

The plasma display device employs plasma light emission in a low-pressure gas for display. Plasma display devices are suitable for increasing the size and capacity. However, the plasma display has the shortcomings with respect to providing a thin display panel and cost. Further, the plasma display device requires a high-voltage AC bias for driving and is thus unsuitable for a portable device.

The inorganic electroluminescent device is a green light emitting display or the like. The inorganic electroluminescent device is driven with an AC bias and requires several hundred volts for driving. It also is difficult to display a full-color image using available inorganic luminescent devices.

On the other hand, electroluminescence by an organic compound has been researched for a long period of time since strong fluorescent luminescence from an anthracene single crystal was observed by injecting a carrier in the early 1960s. However, the research has been made as fundamental research for injecting a carrier into an organic material because of low luminance, monochrome and a single crystal.

Since Tang et al. of Eastman Kodak Corp. reported an organic thin-film electroluminescent element in 1987 which permitted low-voltage driving and high-luminance luminescence, and which had a thin film structure comprising an amorphous luminescent layer, research and development have been extensively made on emission of light of red (R), green (G) and blue (B) primary colors, stability, increases in luminance, the thin film structure, manufacturing methods, etc.

Further, various new materials are invented on the basis of molecular designs, which are characteristics of organic materials, and extensive research is started on applications of an organic electroluminescent display element having excellent characteristics such as DC low-voltage driving, a thin size, luminescence, etc. to a color display.

The organic electroluminescent element (referred to as an "organic EL element" hereinafter) has the ideal characteristics as a self-luminescent display device that it has a thickness of 1 micro meters or less, and converts electrical energy into optical energy to emit light in a plane form by injecting an electric current.

FIG. 13 shows an example of a conventional organic EL element 10. The organic EL element 10 comprises an ITO (Indium tin oxide) transparent electrode 5, a hole transport layer 4, a luminescent layer 3, an electron transport layer 2, and a cathode (for example, an aluminum electrode ) 1, which are deposited on a transparent substrate (for example, a glass substrate) 6 in this order, by, for example, a vacuum deposition method.

When a DC voltage 7 is applied between the transparent electrode 5 as an anode and the cathode 1, holes as the carriers injected from the transparent electrode 5 and the electrons injected from the cathode 1 reach the light emitting layer 3 through the electron transport layer 2 and the hole transport layer 4 to produce recombination of the electrons and holes to emit light 8 with a predetermined wavelength. This can be observed from the back of the transparent substrate 6.

A zinc complex can be contained in the luminescent layer 3. For example, the luminescent layer 3 may comprise substantially only a zinc complex (however, a plurality of zinc complexes may be used), or the layer 3 may contain a zinc complex and a fluorescent material. Alternatively, a zinc complex and another luminescent material such as anthracene, naphthalene, phenanthrene, pyrene, chrysene, perylene, butadiene, coumarin, acridine, stilbene, or the like may be combined. Such a zinc complex or a mixture of a zinc complex and a fluorescent material can also be contained in the electron transport layer 2.

FIG. 14 shows an organic EL element 20 as another conventional example in which the luminescent layer 3 is omitted, and a zinc complex or a mixture of the zinc complex and a fluorescent material is contained in the electron transport layer 2 so as to emit light 18 having a predetermined wavelength from the interface between the electron transport layer 2 and the hole transport layer 4.

FIG. 15 shows an illustrative example of the organic EL display. In FIG. 15, organic layers (the hole transport layer 4 and the light emitting layer 3 or the electron transport layer 2) are provided between the cathode 1 and the anode 5 which are provided in stripes crossing to form a matrix, so that light is emitted from many intersections, or pixels, when a signal voltage is applied from a luminance signal circuit 30 and a control circuit 31 containing a shift register.

The organic EL display configured as described above can thus be used as not only a display but also an image reproducing device. The above stripe pattern is provided for each of red (R), green (G) and blue (B) colors so that the display can be used for full color or multi-color display.

In a display device comprising the organic EL element having a plurality of pixels, the luminescent organic thin film layers 2, 3 and 4 are generally held between the transparent electrode 5 and the metallic electrode 1. Light is emitted from the back of the transparent electrode 5.

However, the above-mentioned organic EL element still has unsolved problems.

For example, in the application of the organic EL element to a color display, it is necessary and essential to emit light of the primary colors R, G and B with stability. However, in the present state, the materials capable of emitting red and blue which can be applied to a display and which have sufficient stability, chromaticity, luminance. The red and blue materials are being studied in various fields. An aluminum-quinoline complex promising as a green luminescent material, but this material has a slight deviation of chromaticity.

In consideration of application to a full-color display, low-voltage driving is necessary and essential, and there is still room for improvement in each of the primary colors R, G and B.

Accordingly, there is a need for an improved optical element and method of manufacturing an optical element capable of emitting light with high luminance with low voltage driving requirements and organic layers with improved stability.

SUMMARY OF THE INVENTION

In light of the problems discussed above, different starting materials must be used for producing luminescent layers of the primary colors R, G and B, thereby causing differences in the characteristics of the organic EL element between the primary colors R, G and B.

Further, the organic EL element must be manufactured in a through vacuum process in order to improve the characteristics of the element, in application to a color display. Such a process is actually difficult due to the necessity to significantly improve a manufacturing apparatus such as a deposition machine, in order to realize low-voltage driving by using different layer structures for the primary colors.

In consideration of the above problems, in order to achieve low-voltage driving in application to a color display, it is preferable to perform processing common to the primary colors R, G and B, and then manufacture a light emitting element having materials and a layer structure common to the primary colors, i.e., a laminate structure comprising an organic hole transport layer, an organic luminescent layer, an organic electron transport layer, and a metallic electrode.

The present invention has been achieved in consideration of the above situation, and an object of the present invention is to provide an optical element and a method of manufacturing the same which can be driven with a low voltage, which emits light with high luminance, and which prevents deterioration in organic layers.

In accordance with an aspect of the present invention, there is provided a optical element comprising an electrode and at least one organic layer adjacent to a surface of said electrode, and wherein the surface of the electrode is treated with a titanate coupling agent having a hydrophobic side chain, the side chain containing a phosphorus.

In the optical element of the present invention, since the titanate coupling agent has the hydrophobic side chain containing phosphorus, the electrode coupled with the titanate coupling agent improves the adhesion of the organic layers, and provides low-voltage driving.

In another aspect of the present invention, there is provided a method of manufacturing an optical element comprising the steps of forming an electrode on a substrate, treating a surface of the electrode with a titanate coupling agent having a hydrophobic side chain, the side chain containing a phosphorus, forming at least one organic layer adjacent to the surface of the electrode.

The manufacturing method of the present invention comprises simple pre-treatment of the electrode with the titanate coupling agent and can thus effectively realize improvement in characteristics and inhibition of deterioration in the organic layers by a generally known simple structure comprising a hole transport layer, a luminescent layer, and an electron transport layer. The manufacturing method also permits easy production of the organic layers having a multi-layer structure by a through vacuum process so as to attain best characteristics of each of the layers.

In the present invention, the titanate coupling agent is a chemical substance having the function that the hydrophilic main chain is bonded to one side of titanium as a central metal, and the hydrophobic side chain is bonded to the other side. Then, if the surface of the electrode is treated by the titanate coupling agent, the main chain is bonded to the electrode, and the side chain is bonded to an organic layer to modify the surface of the electrode and efficiently couple the electrode and the organic layer.

It should be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein.

DETAILED DESCRIPTION OF THE PREFERRED EMBODIMENTS

In an optical element of the present invention, it is preferable to use a titanate coupling agent represented by the following formula:

wherein X is a main chain, and Y is a side chain containing phosphorus.

The main chain X preferably comprises a hetero ring having an oxygen atom as a hetero atom, and the side chain Y preferably comprises dialkyl pyrophosphate. In the alternative, the main chain X comprises a tetraalkyl group, and the side chain Y preferably comprises dialkyl phosphite.

In addition, the functional group of the hydrophobic side chain of the titanate coupling agent preferably contains a long-chain alkyl group.

A surface of an optically transparent electrode is preferably treated with the titanate coupling agent containing phosphorus in the functional group of the hydrophobic side chain.

The element preferably comprises the optically transparent electrode having a surface treated with the titanate coupling agent, an organic hole transport layer, an organic luminescent layer and/or an organic electron transport layer, and a metallic electrode, which are laminated in this order on an optically transparent substrate.

Therefore, the element is suitable as an organic electroluminescent element and a color display device.

The manufacturing method of the present invention preferably comprises surface treatment in which the electrode is dipped in a solution of the titanate coupling agent, and further surface treatment under the action of ultrasonic waves.

The method preferably comprises treating a surface of an optically transparent electrode with the titanate coupling agent containing phosphorus in the functional group of the hydrophobic side chain, and providing organic layers on the treated surface.

The element preferably comprises the optically transparent electrode having a surface treated with the titanate coupling agent, an organic hole transport layer, an organic luminescent layer and/or an organic electron transport layer, and a metallic electrode, which are laminated in this order on an optically transparent substrate.

Therefore, the method is suitable for manufacturing an organic electroluminescent element, and the element is suitable as a color display.

EXAMPLES

Examples of the present invention are described in detail below.

Figure 1:
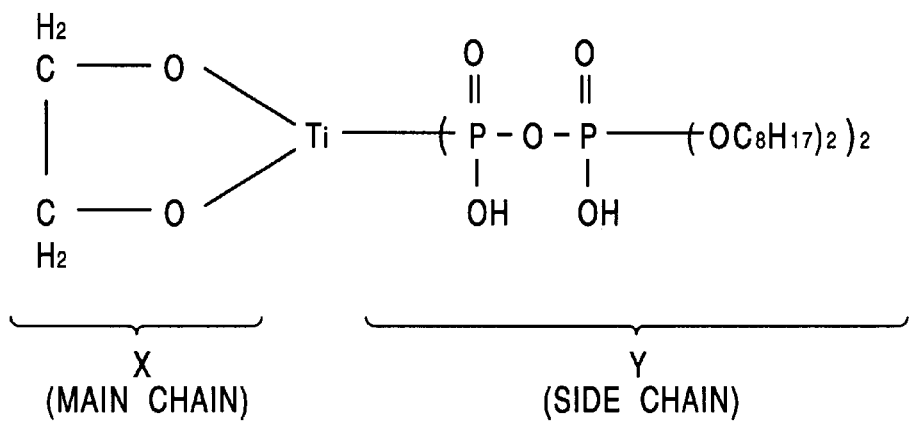
FIG. 1 shows the structural formula of titanate coupling agent I in accordance with the present invention.

FIG. 1 shows the structural formula of titanate coupling agent I used in a first example of the present invention. The titanate coupling agent I comprises main chain X having a five-membered ring containing oxygen atoms as hetero atoms, and side chain Y having a phosphate residue and an alkoxy group (—OC8H17) with phosphorus (P) or a phosphate residue combined therebetween.

In the manufacturing method below using the titanate coupling agent I, surface treatment of a transparent electrode, for example, comprising ITO, on a glass substrate. Above surface treatment facilitates adhesion of an organic layer to the transparent electrode through the titanate coupling agent I.

Figure 2:
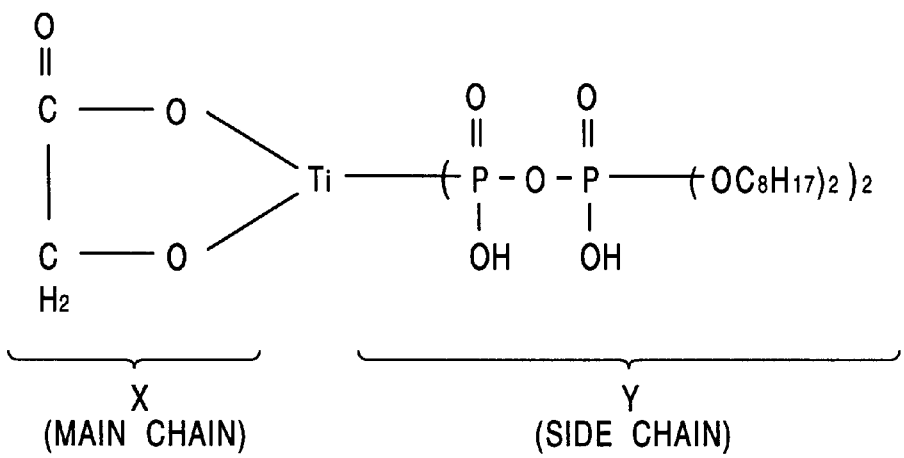
FIG. 2 shows the structural formula of titanate coupling agent II in accordance with the present invention.

FIG. 2 shows the structural formula of titanate coupling agent II used in a second example of the present invention. The titanate coupling agent II comprises main chain X having a five-membered ring containing oxygen atoms as hetero atoms and a carbonyl group, and side chain Y having a phosphate residue and an alkoxy group with phosphorus (P) or a phosphate residue combined therebetween, as in the titanate coupling agent I.

Surface treatment of an ITO transparent electrode with the titanate coupling agent II in the same manner as described above facilitates adhesion of an organic layer to the transparent electrode.

Figure 3:
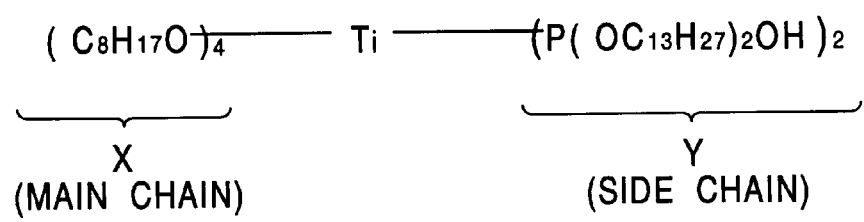
FIG. 3 shows the structural formula of titanate coupling agent III in accordance with the present invention.

FIG. 3 shows the structural formula of titanate coupling agent III used in a third example of the present invention. The titanate coupling agent III comprises main chain X comprising an alkoxy group (C8H17O—), and side chain Y having an alkoxy group (—OC13H27) bonded to phosphorus (P) or a phosphate residue.

Surface treatment of an ITO transparent electrode with the titanate coupling agent III in the same manner as described above also facilitates adhesion of an organic layer to the transparent electrode.

Figure 4:
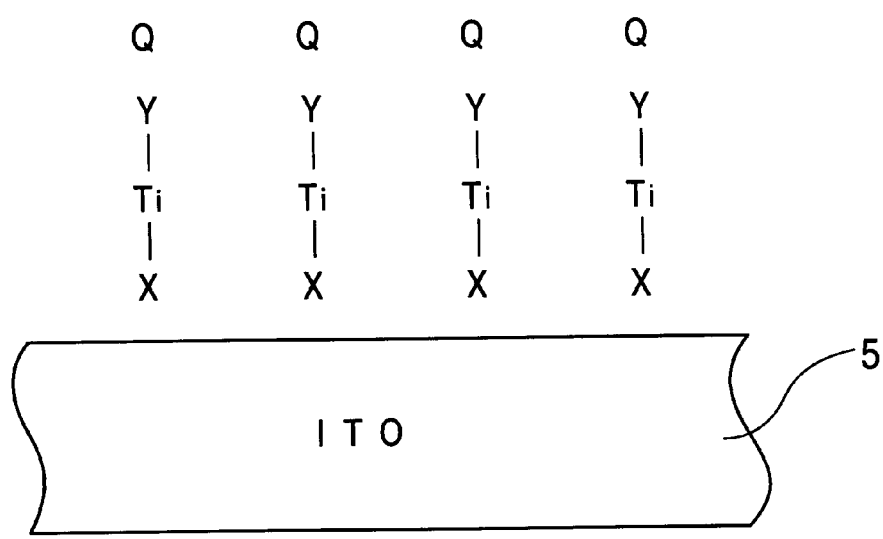
FIG. 4 is a schematic drawing showing the function of a titanate coupling agent in accordance with the present invention.

FIG. 4 is a drawing illustrating schematically the function of the titanate coupling agent (which may be abbreviated as "X—Ti—Y" hereinafter) on the ITO transparent electrode 5 having the surface treated as described above.

As shown in FIG. 4, hydrophilic main chain X of the titanate coupling agent is bonded to the surface of the ITO transparent electrode 5 treated with the titanate coupling agent, the other side Y, bonded to the titanium atom Ti, being directed toward the side of organic molecules Q.

In the state that the titanate coupling agent bonded, the titanate coupling agent adheres in a single layer to the electrode 5. This can be observed by X-ray photoelectron spectroscopy (XPS), a scanning electron microscope (SEM), energy dispersive X-ray spectroscopy (EDX) or the like.

Figure 5:
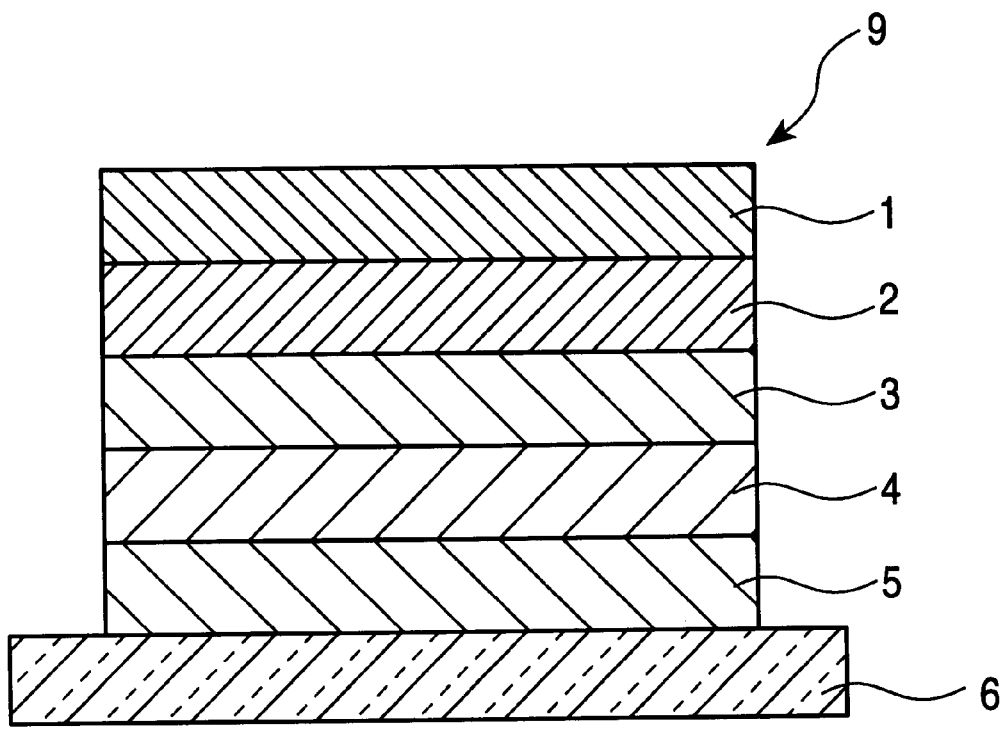
FIG. 5 is a schematic sectional view showing an organic EL element in accordance with the present invention.

The organic EL element of each of the examples respectively using the titanate coupling agents I to III has the structure shown in FIG. 5, and can be produced by the following method.

Figure 14:
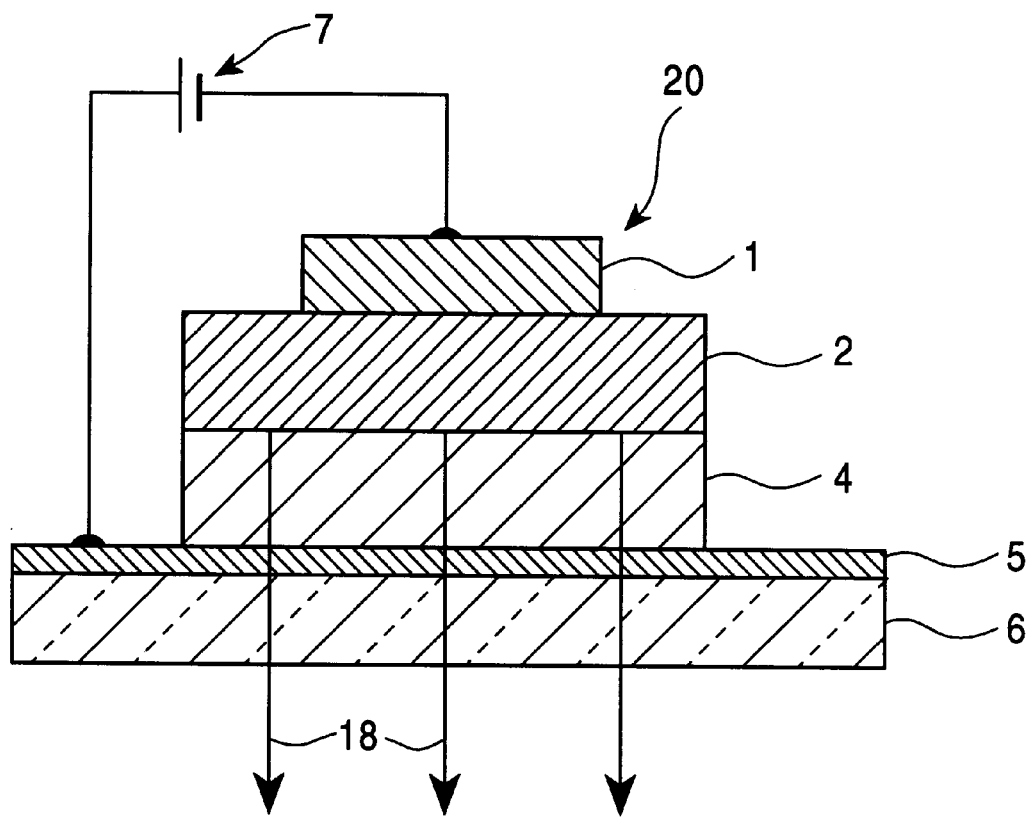
FIG. 14 is a schematic sectional view showing another example of prior art organic EL elements.
Figure 15:
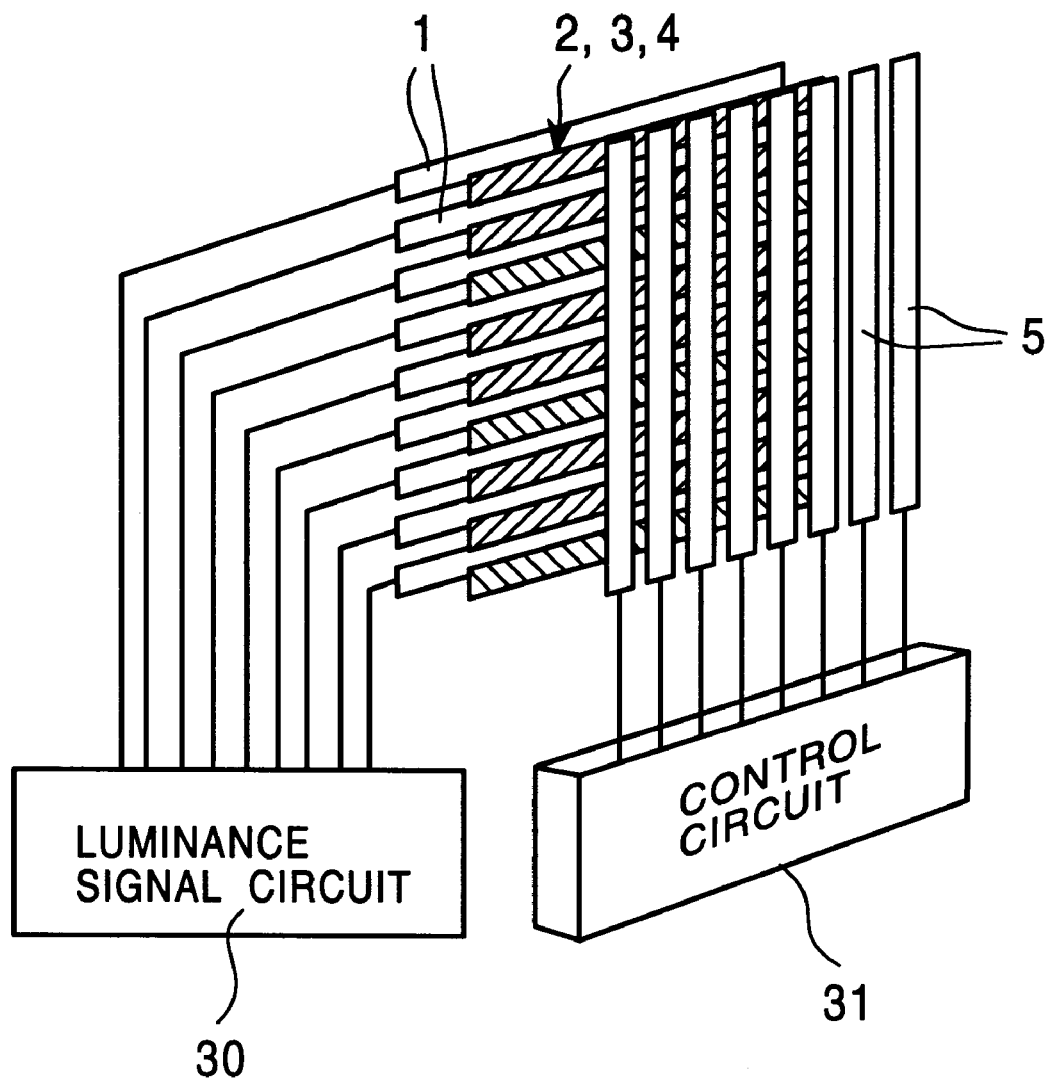
FIG. 15 is a schematic sectional view showing an illustrative example of prior art organic elements.

The transparent electrode 5 (anode) comprising ITO is formed on a glass substrate 6 by a vacuum deposition method, and the surface of the ITO transparent electrode 5 is treated with the titanate coupling agent. As shown in FIG. 5, a hole transport layer 4 comprising TPD (N,N'-diphenyl-N,N'-di(3-methylphenyl)4,4'-diaminobiphenyl), a luminescent layer 3 comprising Alq3 (tris(8-quinolinol) aluminum) and/or an electron transport layer 2, and an aluminum electrode 1 (cathode) are laminated in this order on the treated surface of the ITO transparent electrode 5 by the vacuum deposition method, to produce an organic EL element 9. This element is, of course, effective as a single hetero-type organic EL element (refer to FIG. 14) in which the luminescent layer 3 also functions as the electron transport layer 2 or the hole transport layer 4.

Figure 6:
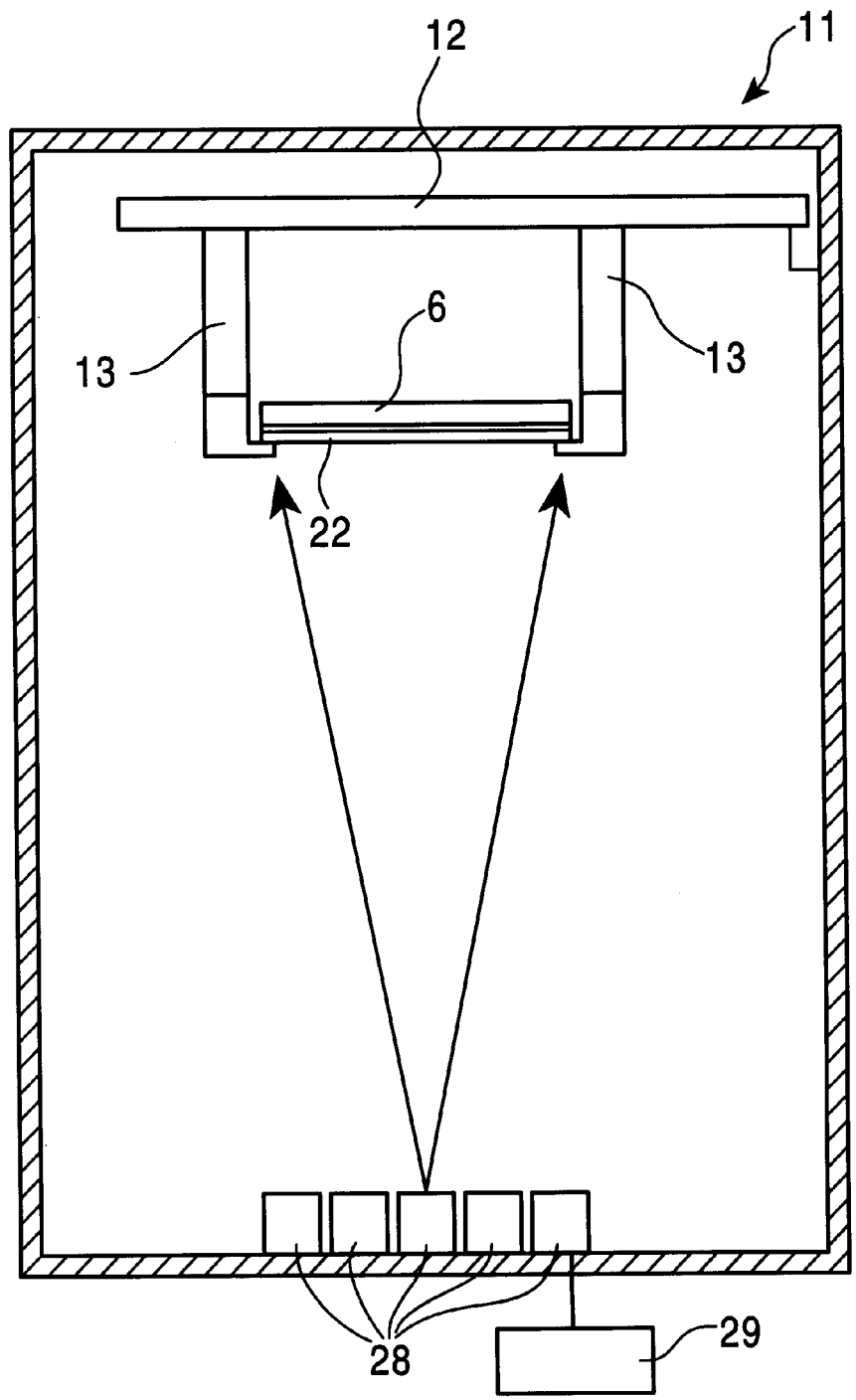
FIG. 6 is a schematic drawing showing a vacuum deposition apparatus used in accordance with the present invention.

On the ITO transparent electrode 5, the organic layers (the hole transport layer 4, the, luminescent layer 3, and the electron transport layer 2), and the aluminum electrode 1 are deposited by the vacuum deposition apparatus 11 shown in FIG. 6. In the vacuum deposition apparatus 11, a pair of support means 13 which are fixed to the lower side of an arm 12, and a stage mechanism (not shown) capable of setting a mask 22 on the transparent glass substrate 6 placed upside down between the support means 13 are provided. A predetermined number of various evaporation sources 28 are disposed below the glass substrate 6 and the mask 22. The evaporation sources 28 are heated by a resistance-heating system. An EB (electron beam) heating system or the like is used for heating the evaporation sources 28 as required.

At first, a surface the ITO transparent electrode 5 formed on the glass substrate 6 is treated with the titanate coupling agent. After the surface of the transparent glass substrate 6 is sufficiently cleaned with an organic solvent and ultraviolet (UV) ozone, the organic layers and the metallic electrode are deposited by the vacuum deposition apparatus 11 using a deposition mask to form adjacent stripes which emit light of the three colors including red (R), green (G) and blue (B).

Figure 7:
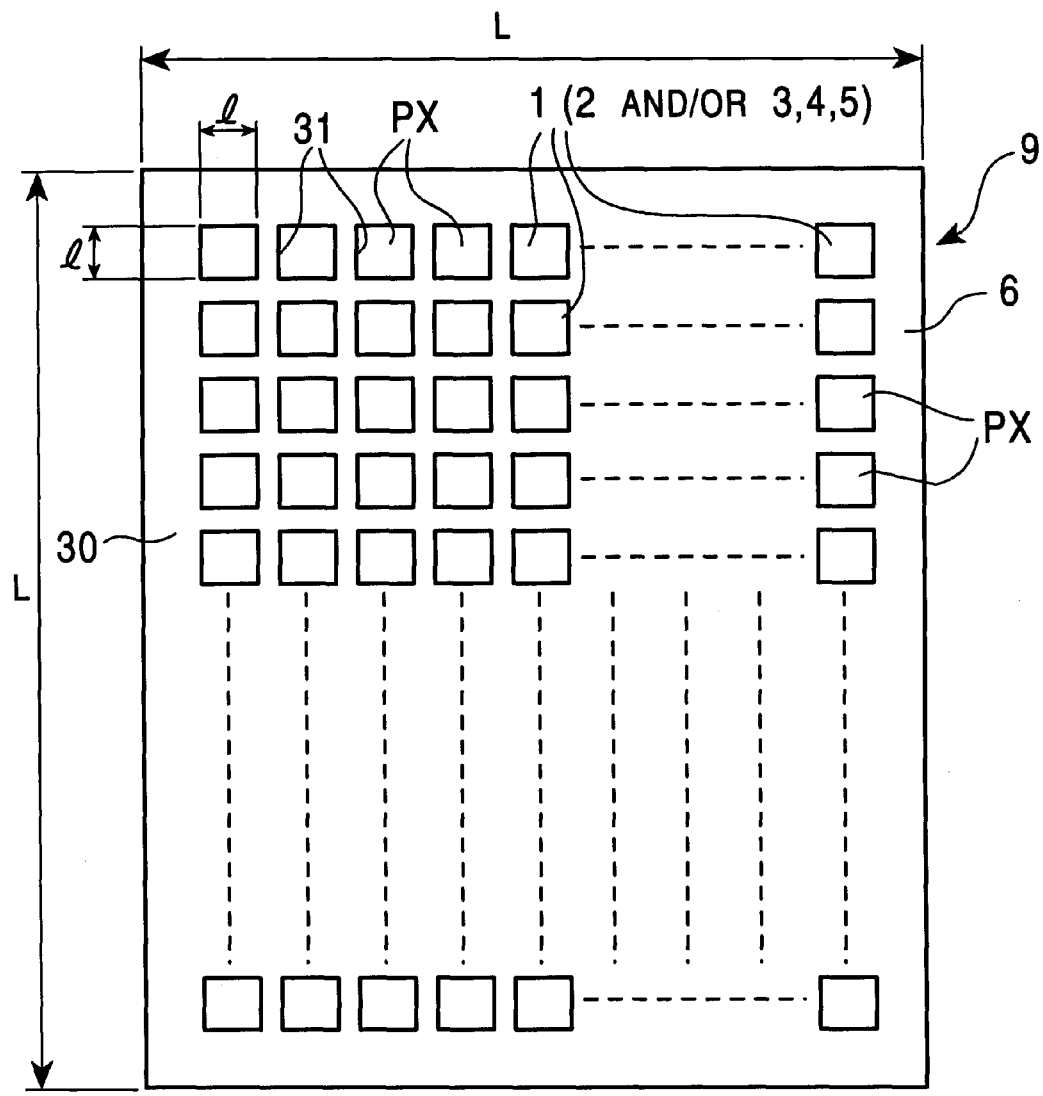
FIG. 7 is a plan view showing an organic EL element comprising many pixels formed on a glass substrate in accordance with the present invention.

FIG. 7 is a plan view showing an example of the organic EL element 9 manufactured by the above-described method. The ITO transparent electrode 5 having size l regions of 2 mm×2 mm is deposited to a thickness of about 100 nm on the glass substrate 6 having size L of 30 mm×30 mm by the above deposition apparatus, SiO2 is then deposited over the whole surface thereof, and etched in a predetermined pixel pattern to form many openings 31 from which the transparent electrode 5 is exposed. Therefore, portions other than the luminescent regions (pixels) PX of 2 mm×2 mm is masked with SiO2. In this state, the substrate 6 is taken out of the deposition apparatus, and the surface of the ITO transparent electrode 5 is treated with the titanate coupling agent. The substrate is again placed in the deposition apparatus shown in FIG. 6, and the organic layers 4, 3 and 2 and the aluminum electrode 1 are formed in this order by using the deposition mask.

The organic EL element and the manufacturing method therefor are described below with reference to examples. In each of the examples, an element comprising an electron transport layer served as a luminescent layer is manufactured.

Example 1

In this example, in manufacturing an organic EL element, SiO2 was first deposited on an ITO electrode (thickness; about 100 nm), provided on the glass substrate 6 of 30 mm×30 mm, other than the luminescent regions of 2 mm×2 mm were masked to form a cell for manufacturing the organic EL element. Then, the ITO electrode surface exposed from the SiO2 mask, was treated with bis(dioctyl pyrophosphate) ethylenetitanate (Preneact KR-238S, produced by Ajinomoto Co., Ltd.) as titanate coupling agent I containing phosphorus (P) in the terminal hydrophobic group and having the structural formula shown in FIG. 1.

In the surface treatment, 0.5% by volume of KR-238S was dissolved in n-hexane to form a treatment (reaction) solution, and coupling reaction was effected in this reaction solution for 1 hour or more under ultrasonic washing. After unreacted KR-238S (for example, on the SiO2 layer) was then washed off with n-hexane, the surface was dried at 120° C. under reduced pressure, washed with acetone and ethanol for 10 minuets each, and then washed with UV ozone at 80° C. for 20 minutes to sufficiently remove the organic material from the surface. However, the surface treatment (the same as in other examples) may be carried out under reaction accelerating conditions or by means other than ultrasonic washing.

Figure 8:
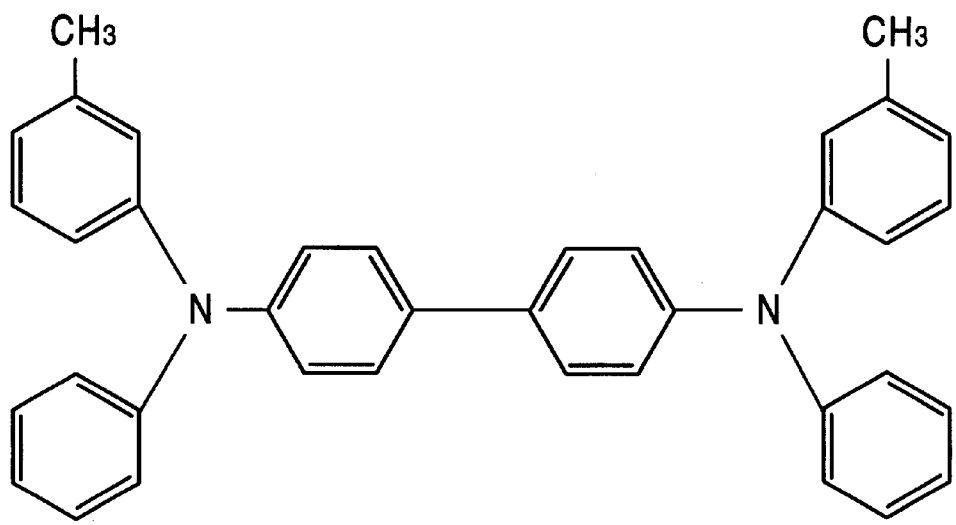
FIG. 8 is a drawing showing the structural formula of TPD as a hole transport layer material in accordance with the present invention.

The glass substrate 6 having the surface-treated ITO transparent electrode 5 was then placed in the vacuum deposition apparatus shown in FIG. 6, and TPD (N,N'-diphenyl-N,N'-di(3-methylphenyl) 4,4'-diaminobiphenyl) shown in FIG. 8 was deposited to a thickness of about 50 nm at a deposition rate of 2 to 4 Å/sec under vacuum by the vacuum deposition method using the deposition mask to form the hole transport layer 4.

A luminescent material, aluminum-quinoline complex Alq3 (tris(8-quinolinol) aluminum) shown in FIG. 9, which had electron transportability, was deposited to a thickness of 50 nm at a deposition rate of 2 to 4 Å/sec on the hole transport layer 4 using the deposition mask to form the luminescent layer 3 which also served as the electron transport layer (the same is true for the examples below). Aluminum was then deposited to a thickness of about 2 kÅ at a deposition rate of 11 to 13 Å/sec to form the metallic electrode 1 as a cathode electrode. In this way, the organic EL element 9 was manufactured.

As a result of measurement of the characteristics of the thus-manufactured organic EL element, luminance of about 700 cd/m2 could be obtained at the applied voltage of 7 V, and the luminescence starting voltage (luminescence threshold voltage) was about 3.5 V. Although the organic EL element showed a start of deterioration in the organic layers and a decrease in luminance at the applied voltage of 7.5 V, deterioration in the organic layers was inhibited, and high luminance could be realized at a low voltage, as compared with Comparative Example 1 below.

Example 2

In Example 2, the surface of the glass substrate 6 having the ITO transparent electrode 5 formed in the pattern shown in FIG. 7 was treated with titanate coupling agent II, bis(dioctyl pyrophosphate) oxyacetate titanate (Preneact KR-138S, produced by Ajinomoto Co., Ltd.), containing phosphorus (P) in the terminal hydrophobic group thereof and represented by the structural formula shown in FIG. 2 in the same manner as Example 1.

In the surface treatment, 0.5% by volume of KR-138S was dissolved in n-hexane to form a reaction solution, and coupling reaction was effected in this reaction solution for 1 hour or more under ultrasonic washing. After unreacted KR-138S was then washed off with n-hexane, the surface was dried at 120° C. under reduced pressure, washed with acetone and ethanol for 10 minutes each, and then washed with UV ozone for 20 minutes.

The glass substrate 6 having the surface-treated ITO transparent electrode 5 was then placed in the vacuum deposition apparatus shown in FIG. 6, and TPD (N,N'-diphenyl-N,N'-di(3-methylphenyl) 4,4'-diaminobiphenyl) shown in FIG. 8 was deposited to a thickness of about 50 nm at a deposition rate of 2 to 4 Å/sec under vacuum by the vacuum deposition method using the deposition mask to form the hole transport layer 4.

Figure 9:
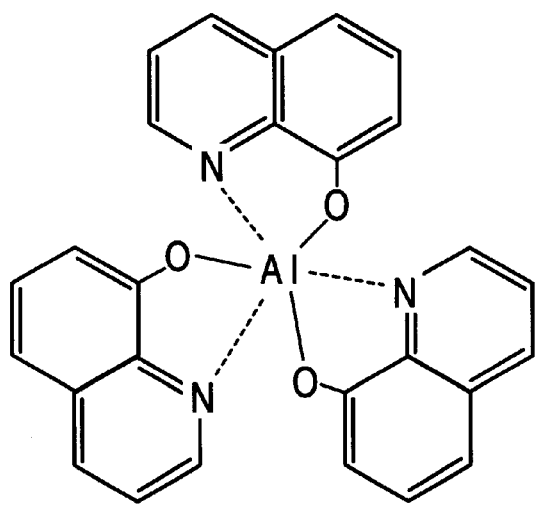
FIG. 9 is a drawing showing the structural formula of an aluminum-quinoline complex as a luminescent layer material in accordance with the present invention.

A luminescent material, aluminum-quinoline complex Alq3 (tris(8-quinolinol) aluminum) shown in FIG. 9, which had electron transportability, was deposited to a thickness of 50 nm at a deposition rate of 2 to 4 Å/sec on the hole transport layer 4 using the deposition mask to form the luminescent layer 3. Aluminum was then deposited to a thickness of about 2 kÅ at a deposition rate of 11 to 13 Å/sec to form the metallic electrode 1 as a cathode electrode. In this way, the organic EL element 9 was manufactured.

As a result of measurement of the characteristics of the thus-manufactured organic EL element, luminance of about 1100 cd/m2 could be obtained at the applied voltage of 9 V, and the luminescence starting voltage was about 3.5 V. Although the organic EL element showed a start of deterioration in the organic layers and a decrease in luminance at the applied voltage of 9.5 V, deterioration in the organic layers was significantly inhibited, and high luminance could be realized at low voltage, as compared with Comparative Example 1 below.

Example 3

In Example 3, the surface of the glass substrate 6 having the ITO transparent electrode 5 formed in the pattern shown in FIG. 7 was treated with titanate coupling agent III, tetraoctyl bis(didodecylphosphite) titanate (Preneact KR-46B, produced by Ajinomoto Co., Ltd.), containing phosphorus (P) and a long-chain alkyl group in the terminal hydrophobic group thereof and represented by the structural formula shown in FIG. 3 in the same manner as Example 1.

In the surface treatment, 0.5% by volume of KR-46B was dissolved in n-hexane to form a reaction solution, and coupling reaction was effected in this reaction solution for 1 hour or more under ultrasonic washing. After unreacted KR-46B was then washed off with n-hexane, the surface was dried at 120° C. under reduced pressure, washed with acetone and ethanol for 10 minutes each, and then washed with UV ozone for 20 minutes.

The glass substrate 6 having the surface-treated ITO transparent electrode 5 was then placed in the vacuum deposition apparatus shown in FIG. 6, and TPD (N,N'-diphenyl-N,N'-di(3-methylphenyl) 4,4'-diaminobiphenyl) shown in FIG. 8 was deposited to a thickness of about 50 nm at a deposition rate of 2 to 4 Å/sec under vacuum by the vacuum deposition method using the deposition mask to form the hole transport layer 4.

A luminescent material, aluminum-quinoline complex Alq3 (tris(8-quinolinol) aluminum) shown in FIG. 9, which had electron transportability, was deposited to a thickness of 50 nm at a deposition rate of 2 to 4 Å/sec on the hole transport layer 4 using the deposition mask to form the luminescent layer 3. Aluminum was then deposited to a thickness of about 2 kÅ at a deposition rate of 11 to 13 Å/sec to form the metallic electrode 1 as a cathode electrode. In this way, the organic EL element 9 was manufactured.

As a result of measurement of the characteristics of the thus-manufactured organic EL element, luminance of about 1000 cd/m2 could be obtained at the applied voltage of 12 V, and the luminescence starting voltage was about 4.0 V. Although the organic EL element short-circuited at the applied voltage of 12.5 V, no deterioration was observed in the organic layers immediately before applying this voltage. Therefore, the organic EL element exhibiting no deterioration in the organic layers and suitable for driving a high voltage could be realized, as compared with Comparative Example 1 below.

Comparative Example 1

In Comparative Example 1, the glass substrate 6 having the ITO transparent electrode 5 formed in the pattern shown in FIG. 7 was used, as in Example 1. In comparative example I, the surface of the ITO transparent electrode 5 was not treated with a titanate coupling agent, and, in the apparatus shown in FIG. 6, TPD (N,N'-diphenyl-N,N'-di(3-methylphenyl) 4,4'-diaminobiphenyl) shown in FIG. 8 was deposited to a thickness of about 50 nm at a deposition rate of 2 to 4 Å/sec under vacuum by the vacuum deposition method to form the hole transport layer 4 on the untreated surfaces.

A luminescent material, aluminum-quinoline complex Alq3 (tris(8-quinolinol) aluminum) shown in FIG. 9, which had electron transportability, was deposited to a thickness of 50 nm at a deposition rate of 2 to 4 Å/sec on the hole transport layer 4 using the deposition mask to form the luminescent layer 3. Aluminum was then deposited to a thickness of about 2 kÅ at a deposition rate of 11 to 13 Å/sec to form the metallic electrode 1 as a cathode electrode. In this way, the organic EL element 9 was manufactured.

As a result of measurement of the characteristics of the thus-manufactured organic EL element, luminance of about 650 cd/m2 could be obtained at the applied voltage of 8 V, and the luminescence starting voltage was about 4.5 V. The organic EL element showed a start of deterioration in the organic layers and a decrease in luminance at the applied voltage of 8.5 V, and the element itself sometimes dissolved at 8.5 V or more. The organic EL element rapidly caused deterioration in the organic layers with increases in the voltage, as compared with Examples 1 to 3. In addition, the organic layers significantly deteriorated, and early started deteriorating at a low voltage, as compared with Examples 1 to 3.

Comparative Example 2

Figures 10, 11:
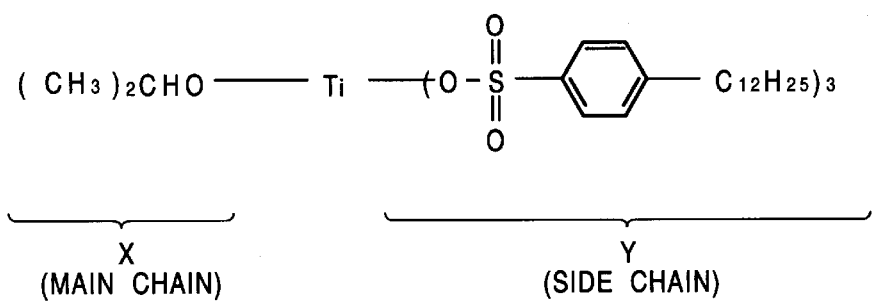
FIG. 10 is a drawing showing the structural formula of a titanate coupling agent used in a comparative example.
FIG. 11 is a table showing the evaluation results of surface energy of ITO transparent electrodes of examples and comparative examples.

In Comparative Example 2, the surface of the glass substrate 6 having the ITO transparent electrode 5 formed in the pattern shown in FIG. 7 was treated with a titanate coupling agent, isopropyl tridodecylbenzenesulfonyl titanate (Preneact KR-9SA, produced by Ajinomoto Co., Ltd.), containing a benzene ring in the terminal hydrophobic group thereof and represented by the structural formula shown in FIG. 10 in the same manner as Example 1.

In the surface treatment, 0.5% by volume of KR-9SA was dissolved in n-hexane to form a reaction solution, and coupling reaction was effected in this reaction solution for 1 hour or more under ultrasonic washing. After unreacted KR-9SA was then washed off with n-hexane, the surface was dried at 120° C. under reduced pressure, washed with acetone and ethanol for 10 minutes each, and then washed with UV ozone for 20 minutes.

The glass substrate 6 having the surface-treated ITO transparent electrode 5 was then placed in the vacuum deposition apparatus shown in FIG. 6, and TPD (N,N'-diphenyl-N,N'-di(3-methylphenyl) 4,4'-diaminobiphenyl) shown in FIG. 8 was deposited to a thickness of about 50 nm at a deposition rate of 2 to 4 Å/sec under vacuum by the vacuum deposition method using the deposition mask to form the hole transport layer 4.

A luminescent material, aluminum-quinoline complex Alq3 (tris(8-quinolinol) aluminum) shown in FIG. 9, which had electron transportability, was deposited to a thickness of 50 nm at a deposition rate of 2 to 4 Å/sec on the hole transport layer 4 using the deposition mask to form the luminescent layer 3. Aluminum was then deposited to a thickness of about 2 kÅ at a deposition rate of 11 to 13 Å/sec to form the metallic electrode 1 as a cathode electrode. In this way, the organic EL element 9 was manufactured.

As a result of measurement of the characteristics of the thus-manufactured organic EL element, luminance of about 700 cd/m2 could be obtained at the applied voltage of 8.5 V, and the luminescence starting voltage was about 4.0 V. The organic EL element had substantially the same characteristics as Comparative Example 1, and showed no contribution to low-voltage driving.

When the surface energy of the surface of the ITO transparent electrode 5 of each of the organic EL elements produced in Examples and Comparative Examples was measured by a contact angle measurement method, the results obtained showed that the surface energy of the elements of Examples 1 to 3 each of which was surface-treated with the titanate coupling agent was more deceased than the element of Comparative Example 1 without surface treatment, as shown in FIG. 11. However, in Comparative Example 2 using the titanate coupling agent without phosphorus in the terminal hydrophobic group thereof, the surface energy was increased in comparison with Comparative Example 1.

As a result of the same measurement on other samples, samples having surfaces treated with the titanate coupling agents used in Examples 1 to 3, which had the effect on low-voltage driving, had the tendency that the surface energy of the ITO transparent electrode decreased. It is thus thought that the adhesion of an organic layer to the transparent electrode is improved due to a decrease in surface energy, and that the use of the titanate coupling agents shown in FIGS. 1 to 3 decreases the surface energy of the transparent electrode, and has the effect on low-voltage driving. This was confirmed by the data shown in FIG. 12.

Figure 12:
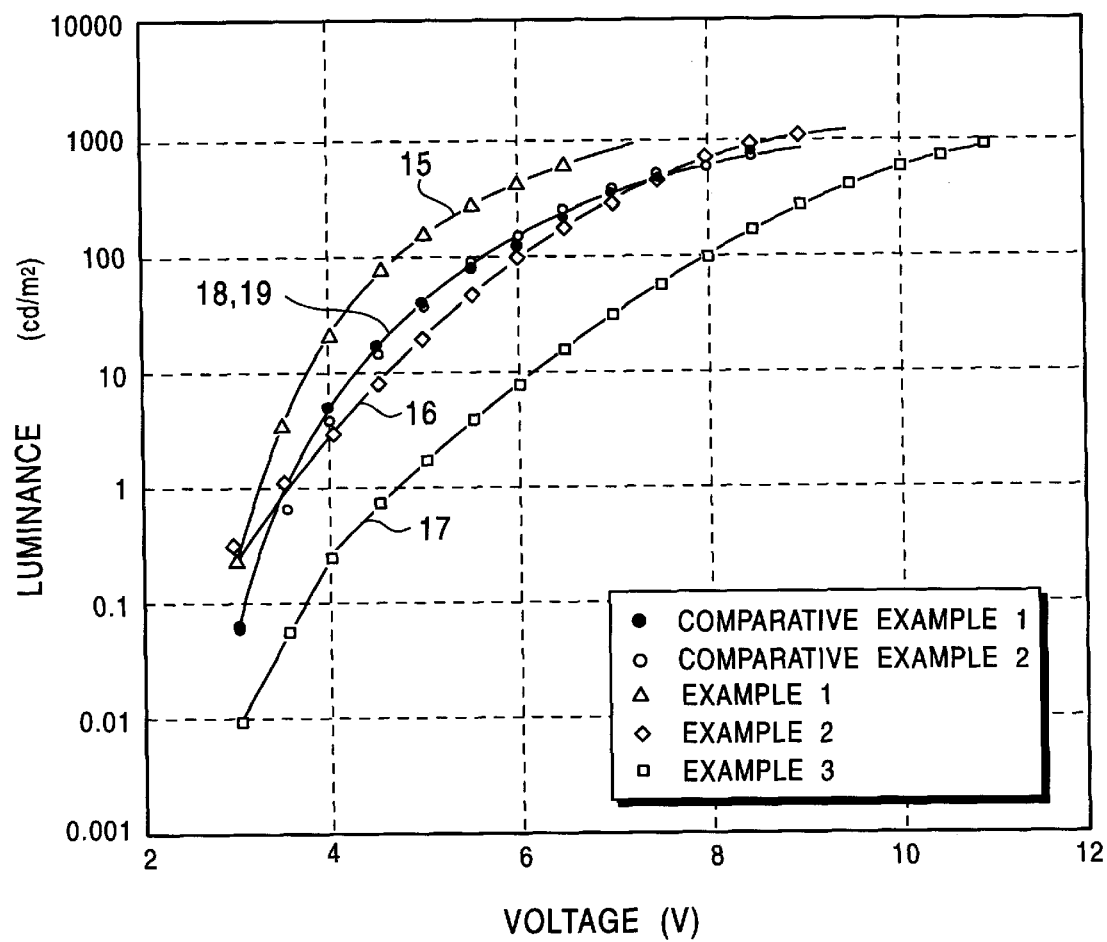
FIG. 12 is a graph showing comparison of the characteristics of organic EL elements of examples and comparative examples.
Figure 13:
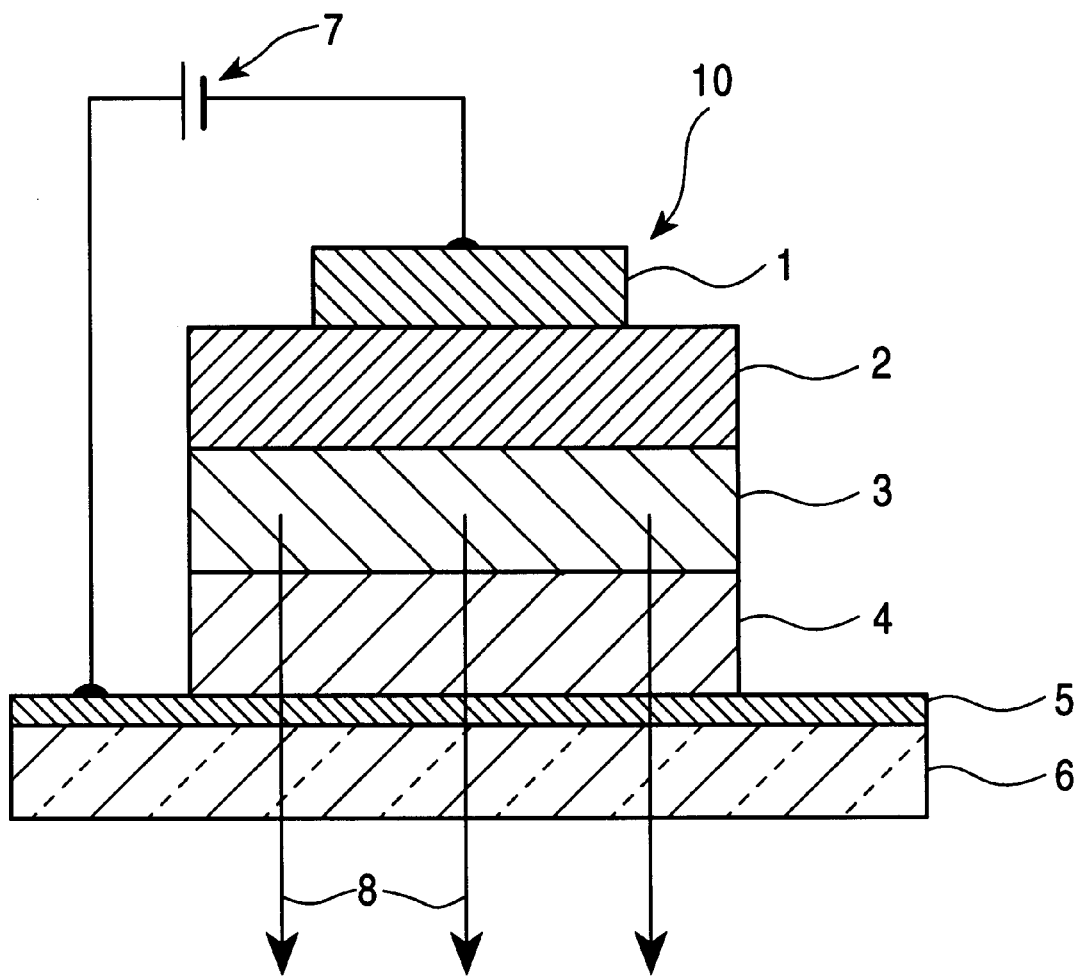
FIG. 13 is a schematic sectional view showing an example of prior art organic EL elements.

FIG. 12 is a graph collectively showing the results of measurement of the characteristics of the organic element produced in each of Examples and Comparative Examples. This graph shows plots of the measured values and indicates relations between the applied voltage and luminance. In the graph, reference numerals 15, 16, 17, 18 and 19 indicate curves based on the measurements of the first example, the second example, the third example, Comparative Example 1 and Comparative Example 2, respectively.

As be seen from the results, Example 1 shown by data 15 shows a start of luminescence at about 3.5 V, and a high luminance at the start of light emission and good rising at low voltages to luminance of about 700 cd/m2 at the applied voltage of 7 V. However, in increasing the voltage, deterioration in the organic layers starts at 7.5 V, but the deterioration is more inhibited than in the comparative examples.

In comparison with Example 1, although Example 2 shown by data 16 shows a start of luminescence at about 3.5 V and poor rising of luminance, it shows a luminance of about 1100 cd/m2 at a voltage of about 9 V which is higher than Example 1. Although the organic layer starts deteriorating at about 9.5 V, deterioration can be significantly inhibited as compared with the comparative examples below.

Example 3 shown by data 17 exhibits a start of luminescence at about 4 V and a luminance of about 1000 cd/m2 at 12 V. Although luminance rises slower than the above Examples 1 and 2, high luminance is exhibited at high voltages, and deterioration in the organic layers is also significantly inhibited, as compared with the comparative examples below.

On the other hand, Comparative Examples 1 and 2 exhibit a start of luminescence at about 4.5 and 4 V, and luminance of about 650 cd/m2 at 8 V and about 700 cd/m2 at 8.5 V, respectively. However, Comparative Example 1 shows early a start of deterioration in the organic layers, and a high degree of deterioration (the same is true for Comparative Example 2). This is probably due to the poor adhesion between the ITO transparent electrode and the organic layer (increase in surface energy).

As described above, it is thus apparent that the organic EL elements of Examples 1 to 3 exhibit excellent low-voltage driving and luminance, less deterioration in the organic layers and high reliability. Particularly, Example 1 shows excellent low-voltage driving and high luminance, and less deterioration in the organic layers due to a decrease in surface energy, and thus has significant superiority.

As described above, in the examples, phosphorus (or a phosphate residue) is contained in the side chain of the titanate coupling agent so as to decrease the surface energy of the ITO transparent electrode, thereby improving the film forming properties of the organic layers and the bonding state between the ITO transparent electrode and the organic layers laminated thereon. As a result, holes are sufficiently injected from the ITO transparent electrode, the luminescence threshold voltage is low, and the low-voltage driving properties, durability or resistance to deterioration (resistance to voltage) are improved, as well as luminance being improved.

In manufacture of a full color display, it is hitherto difficult and disadvantage from the viewpoint of equipment investment to manufacture the organic layers in a multi-layer structure by a through vacuum process so as to obtain the best characteristics of each of the layers. However, the simple pre-treatment of the glass substrate having the transparent electrode with one of the titanate coupling agents I to III has the effect of improving the characteristics and inhibiting deterioration in the organic layers even in a generally known simple structure comprising the electron transport layer, the luminescent layer and the hole transport layer. Therefore, the organic layers for respective colors can be formed in a multi-layer structure common to the colors, and the through vacuum process thus becomes possible.

Although the examples of the present invention are described above, various modifications of the examples can be made on the basis of the technical idea of the present invention.

For example, any agents other than the above-described agents may be used as long as main chain X in the formula X—Ti—Y has a hydrophilic group which can combine with the ITO transparent electrode, or side chain Y has affinity for organic materials.

In addition, the number of the phosphorus atoms contained in the side chain may be other than the above, for example, 3 or more, and the phosphorus position may be changed. Phosphorus may be introduced into the main chain so as to cause the same function as the side chain.

Further, the type of the long alkyl group in the side chain may be changed, for example, the carbon number may be changed within the range of 6 or more so as to control the physical properties such as the hydrophobic nature.

The valence (the number of bonds) of titanium can appropriately be selected, and not limited to the above value.

Possible methods of surface-treating the ITO transparent electrode with the titanate coupling agent include spray coating and vapor deposition of a solution other than the method of dipping the glass substrate having the ITO transparent electrode deposited thereon in the solution. In the surface treatment, coupling reaction is preferably accelerated by external energy such as ultrasonic irradiation or the like.

The materials for the anode electrode, the electron transport layer, the hole transport layer and the cathode electrode are not limited to the above materials. Examples of materials for the hole transport layer include hole transportable organic materials such as benzidine derivatives, styrylamine derivatives, triphenylmethane derivatives, hydrazone derivatives, and the like. Examples of materials for the electron transport layer include electron transportable organic materials such as perylene derivative, bisstyryl derivative, pyrazine derivatives, and the like.

In order to improve injection of electrons, a metal having a low work function from the vacuum level of the electrode material is preferably used as the cathode electrode material. Examples of such metals other than aluminum include indium, magnesium, silver, calcium, barium, lithium, and the like. These metals with low work function may be used singly or used as alloys with other metals for increasing stability.

Although, in the present invention, the ITO transparent electrode is used as the anode electrode in order to obtain organic electroluminescence from the anode electrode side, an electrode having a high work function from the vacuum level of the anode electrode material, e.g., a tin dioxide-antimony mixture, a zinc oxide-aluminum mixture, or the like, may be used for efficiently injecting holes.

Although each of the above-mentioned examples relates to the monocolor organic EL element, a full-color or multi-color organic EL element emitting light of the three colors R, G and B can be manufactured by the above method using the selected luminescent materials. The present invention can be applied to not only an organic EL element for a display but also an organic EL element which can be used for a light source, and can be used for other optical applications.

From the above description, it is apparent that the objects of the present invention have been achieved. While only certain embodiments have been set forth, alternative embodiments and various modifications will be apparent from the above description to those skilled in the art. These and other alternatives are considered equivalents and with the spirit and scope of the present invention.

What is claimed is:

1. An optical organic EL element comprising:
   an optically transparent electrode,
   an organic layer, and
   a titanate coupling agent, said titanate coupling agent coupling said organic layer to said electrode, said titanate coupling agent comprises a hydrophobic side chain and a hydrophillic main chain, said hydrophobic side chain comprising phosphorus, said hydrophobic side chain being bonded to the organic layer, said hydrophillic main chain being bonded to the electrode.

2. The optical element of claim 1 wherein said titanate coupling agent is represented by the following formula:

wherein X is a main chain and Y is a side chain, said main chain being bonded to the electrode, said side chain being bonded to the organic layer.

3. The optical element of claim 2 wherein said side chain Y is a hydrophobic side chain comprising phosphorus.

4. The optical element of claim 2 wherein said main chain X comprises a hetero ring comprising an oxygen atom as a hetero atom.

5. The optical element of claim 2 wherein said side chain Y comprises dialkyl pyrophosphate.

6. A method of manufacturing an optical organic EL element comprising:
   forming an optically transparent electrode on a substrate,
   treating a surface of said electrode with a titanate coupling agent having the formula

wherein X is a hydrophillic main chain and Y is a hydrophobic side chain, said main chain being bonded to the electrode,
   forming at least one organic layer adjacent to said surface of said electrode, said organic layer bonding with said side chain of the titanate coupling agent.

* * * * *